US012740270B2

(12) United States Patent
Chen et al.

(10) Patent No.: US 12,740,270 B2
(45) Date of Patent: Sep. 15, 2026

(54) DISPLAY SUBSTRATE, DISPLAY PANEL, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Tianci Chen, Beijing (CN); Yuanqi Zhang, Beijing (CN); Chang Luo, Beijing (CN); Yi Zhang, Beijing (CN); Conglei Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 415 days.

(21) Appl. No.: 18/688,070

(22) PCT Filed: Dec. 16, 2022

(86) PCT No.: PCT/CN2022/139770

§ 371 (c)(1),
(2) Date: Feb. 29, 2024

(87) PCT Pub. No.: WO2024/124577

PCT Pub. Date: Jun. 20, 2024

(65) Prior Publication Data

US 2025/0126992 A1 Apr. 17, 2025

(51) Int. Cl.
*H01L 29/04* (2006.01)
*H01L 29/10* (2006.01)
(Continued)

(52) U.S. Cl.
CPC ......... *H10K 59/131* (2023.02); *H10K 59/122* (2023.02); *H10K 59/873* (2023.02); *H10K 59/88* (2023.02)

(58) Field of Classification Search
CPC .. H10K 59/131; H10K 59/122; H10K 59/873; H10K 59/88; H10K 59/12; H10K 59/40; H10K 77/111; H10D 99/00
See application file for complete search history.

(56) References Cited

U.S. PATENT DOCUMENTS

2019/0207157 A1 7/2019 Gong et al.
2020/0136087 A1 4/2020 Kim et al.

FOREIGN PATENT DOCUMENTS

CN 107845667 A * 3/2018 ......... H10K 50/8428
CN 107302014 B 6/2020
(Continued)

OTHER PUBLICATIONS

PCT/CN2022/139770 international search report dated Jun. 19, 2023.
PCT/CN2022/139770 Written Opinion dated Jun. 19, 2023.

*Primary Examiner* — Niki H Nguyen
(74) *Attorney, Agent, or Firm* — IPro, PLLC

(57) ABSTRACT

A display substrate, a display panel, and a display apparatus are provided. The display substrate includes a display area and a non-display area on at least one side of the display area, the non-display area including at least a retaining-wall area, a crack-blocking area, and a cut-retention area in a direction away from the display area. The display substrate includes a base substrate, an insulating layer, a first inorganic layer, and a first dummy metal layer. The insulating layer is on the base substrate, to form a blocking-area raised layer in the crack-blocking area. The first inorganic layer is on the insulating layer and at least partially covers the blocking-area raised layer, and the first inorganic layer is formed with a first slope and a second slope corresponding to opposing sides of the blocking-area raised layer, respectively, the first slope being closer to the display area than the second slope. The first dummy metal layer is in the non-
(Continued)

display area and covers at least a portion of the first slope and at least a portion of the second slope.

20 Claims, 8 Drawing Sheets

(51) Int. Cl.

| | |
|---|---|
| ***H01L 31/00*** | (2006.01) |
| ***H10K 59/122*** | (2023.01) |
| ***H10K 59/131*** | (2023.01) |
| ***H10K 59/80*** | (2023.01) |
| ***H10K 59/88*** | (2023.01) |

(56) References Cited

FOREIGN PATENT DOCUMENTS

| | | | |
|---|---|---|---|
| CN | 111415965 | A | 7/2020 |
| CN | 111769155 | A | 10/2020 |
| CN | 112038503 | A | 12/2020 |
| CN | 213184348 | U | 5/2021 |

* cited by examiner

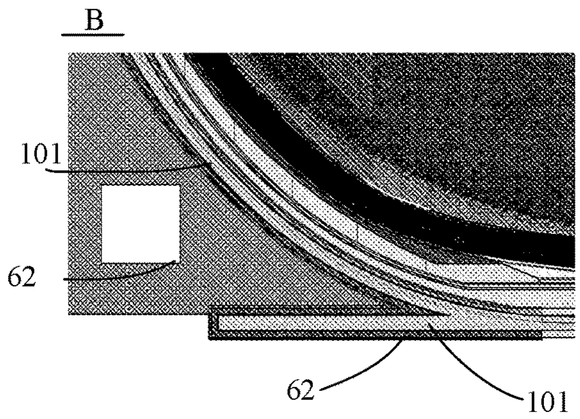
FIG. 5
C
102
62（61）
D3
601
602
FIG. 6
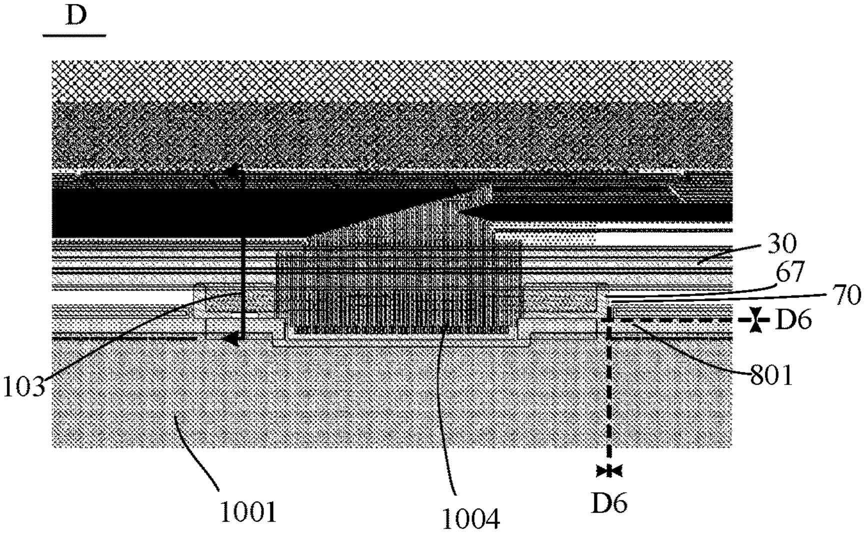
FIG. 7

DISPLAY SUBSTRATE, DISPLAY PANEL, AND DISPLAY APPARATUS

CROSS-REFERENCE TO RELATED APPLICATIONS

This disclosure is the U.S. national phase of PCT Application No. PCT/CN2022/139770 filed on Dec. 16, 2022, the disclosure of which is incorporated herein by reference in its entirety.

TECHNICAL FIELD

The present disclosure relates to the field of display technology, and in particular to a display substrate, a display panel, and a display apparatus.

BACKGROUND

OLED (Organic Light-Emitting Diode) display panels with curved edge design have been increasingly used in mobile phones, televisions, computers, and other electronic devices. A display panel with curved edge design has a certain curvature and thus is curved in an edge area thereof, such that the display panel is prone to layer delamination in the edge area.

SUMMARY

According to a first aspect of embodiments of the present invention, there is provided a display substrate, including a display area and a non-display area on at least one side of the display area, the non-display area including at least a retaining-wall area, a crack-blocking area, and a cut-retention area in a direction away from the display area, the display substrate including:

a base substrate;

an insulating layer on the base substrate, the insulating layer including a blocking-area raised layer in the crack-blocking area;

a first inorganic layer on the insulating layer and at least partially covering the blocking-area raised layer, where the first inorganic layer includes a first slope and a second slope respectively corresponding to opposite sides of the blocking-area raised layer, the first slope being closer to the display area than the second slope; and a first dummy metal layer in the non-display area and covering at least a portion of the first slope and at least a portion of the second slope.

In some embodiments, the first dummy metal layer further covers an area between the first slope and the second slope.

In some embodiments, the first inorganic layer is in the retaining-wall area and has a retaining-wall slope facing the crack-blocking area on a surface thereof, and the first dummy metal layer further covers the retaining-wall slope.

In some embodiments, the display substrate further includes a second dummy metal layer disposed on the first dummy metal layer.

In some embodiments, the non-display area is provided with a signal line transfer hole on a bottom of the display substrate;

the insulating layer is discontinuous in the crack-blocking area on the bottom of the display substrate, to form a fifth slope on opposite sides of the signal line transfer hole in a width direction of the display substrate and facing the display area; and the display substrate includes a dummy metal block covering at least a portion of the fifth slope.

In some embodiments, the display substrate further includes a second inorganic layer, where the second inorganic layer covers the dummy metal block and at least a portion of the first inorganic layer, and an edge of the second inorganic layer extends 5 μm to 15 μm from an edge of the dummy metal block to a side away from the display area.

In some embodiments, the non-display area further includes a stress-assurance area on a side of the cut-retention area away from the display area;

the insulating layer has an assurance-area raised structure in the stress-assurance area, the assurance-area raised structure being separated from the rest of the insulating layer;

the first inorganic layer covers the assurance-area raised structure, and has a third slope and a fourth slope on a surface thereof away from the base substrate and corresponding to both sides of the assurance-area raised structure, the third slope being closer to the display area than the fourth slope; and the display substrate further includes a third dummy metal layer in the stress-assurance area and covering at least a portion of the third slope and at least a portion of the fourth slope.

In some embodiments, the third dummy metal layer includes a first metal portion covering the third slope and a second metal portion covering the fourth slope.

In some embodiments, the third dummy metal layer further includes a third metal portion between the first metal portion and the second metal portion and connecting the first metal portion and the second metal portion.

In some embodiments, the first metal portion includes a solid metal layer, a mesh metal layer, or a metal layer formed by connecting the solid metal layer and the mesh metal layer, the second metal portion includes a solid metal layer, a mesh metal layer, or a metal layer formed by connecting the solid metal layer and the mesh metal layer, and the third metal portion includes a mesh metal layer or a solid metal layer.

In some embodiments, the display substrate includes:

a fourth dummy metal layer overlying the third dummy metal layer.

In some embodiments, the fourth dummy metal layer and the third dummy metal layer have a same structure, the first metal portion includes the solid metal layer at least in a portion of the first metal portion close to the cut-retention area, and the fourth dummy metal layer has a first wrapping edge formed on a side thereof close to the cut-retention area and extending a first preset distance from an edge of the first metal portion to a side close to the cut-retention area; and/or the second metal portion includes the solid metal layer at least in a portion of the second metal portion away from the cut-retention area, and the fourth dummy metal layer has a second wrapping edge formed on a side thereof away from the cut-retention area and extending a second preset distance from an edge of the second metal portion to a side away from the cut-retention area.

In some embodiments, the display substrate has a rough cut channel on a side of the stress-assurance area away from the display area, and an edge of the third dummy metal layer is at a third preset distance from the rough cut channel, the third preset distance being 10 μm or more.

In some embodiments, the first dummy metal layer includes a fourth metal portion covering the first slope and a fifth metal portion covering the second slope.

In some embodiments, the first dummy metal layer further includes a sixth metal portion between the fourth metal portion and the fifth metal portion and connecting the fourth metal portion and the fifth metal portion.

In some embodiments, the fourth metal portion includes a solid metal layer, a mesh metal layer, or a metal layer formed by connecting the solid metal layer and the mesh metal layer, the fifth metal portion includes a solid metal layer, a mesh metal layer, or a metal layer formed by connecting the solid metal layer and the mesh metal layer, and the sixth metal portion includes a mesh metal layer or a solid metal layer.

In some embodiments, the second dummy metal layer and the first dummy metal layer have a same structure, the fourth metal portion includes the solid metal layer at least in a portion of the fourth metal portion close to the retaining-wall area, and the second dummy metal layer has a third wrapping edge formed on a side thereof away from the cut-retention area and extending a fourth preset distance from an edge of the fourth metal portion to a side away from the cut-retention area; and/or the fifth metal portion includes the solid metal layer at least in a portion of the fifth metal portion close to the cut-retention area, and the second dummy metal layer has a fourth wrapping edge formed on a side thereof close to the cut-retention area and extending a fifth preset distance from an edge of the fifth metal portion to a side close to the cut-retention area.

In some embodiments, the display substrate includes a pixel driving circuit layer, a light-emitting layer, an encapsulation layer, and a touch layer which are sequentially stacked on the base substrate in the display area;

the insulating layer further includes a portion in the display area, which is at least one of an interlayer dielectric layer of the pixel driving circuit layer, a planarization layer of the pixel driving circuit layer, or a pixel definition layer of the light-emitting layer;

the first inorganic layer further includes a portion in the display area, which is an inorganic layer of the touch layer disposed on a surface of the encapsulation layer; and the touch layer further includes a first touch metal layer, a second inorganic layer, and a second touch metal layer which are sequentially stacked on the first inorganic layer, where the first dummy metal layer and the third dummy metal layer are arranged in a same layer as the first touch metal layer, a second dummy metal layer is further disposed on the first dummy metal layer, and the second dummy metal layer and the fourth dummy metal layer are arranged in a same layer as the second touch metal layer.

In some embodiments, a fifth dummy metal layer is disposed on the first inorganic layer in the cut-retention area, the fifth dummy metal layer is between the first dummy metal layer and a third dummy metal layer and connects the first dummy metal layer and the third dummy metal layer, and the fifth dummy metal layer includes a mesh metal layer; and a sixth dummy metal layer is disposed on the fifth dummy metal layer, a second dummy metal layer is further disposed on the first dummy metal layer, and the sixth dummy metal layer is between the second dummy metal layer and the fourth dummy metal layer and connects the second dummy metal layer and the fourth dummy metal layer.

According to a second aspect of embodiments of the present invention, there is provided a display panel including a cover plate and the display substrate as described above.

According to a third aspect of embodiments of the present invention, there is provided a display apparatus including the display panel as described above.

With the above display substrate, the display panel, and the display apparatus according to the present application, the first inorganic layer at least partially covers the blocking-area raised layer, to form the first slope and the second slope (i.e., slopes at positions with attitude differences on both sides of the first organic layer and the second organic layer) respectively corresponding to opposite sides of the blocking-area raised layer. Moreover, the first dummy metal layer is provided on at least a portion of the first slope and at least a portion of the second slope, to apply a downward force to at least the portion of the first slope and at least the portion of the second slope, which can reduce the risk of delamination between the organic layer (e.g., the second organic layer) and the inorganic layer (e.g., the first inorganic layer) in the non-display area, and improve the capability of the non-display area of the display substrate to withstand a relatively large pre-stress.

BRIEF DESCRIPTION OF DRAWINGS

FIG. 5 is a schematic enlarged view of part B of the display substrate shown in FIG. 1.

FIG. 6 is a schematic enlarged view of part C of the display substrate shown in FIG. 1.

FIG. 7 is a schematic enlarged view of part D of the display substrate shown in FIG. 1.

DETAILED DESCRIPTION

Figure 1:
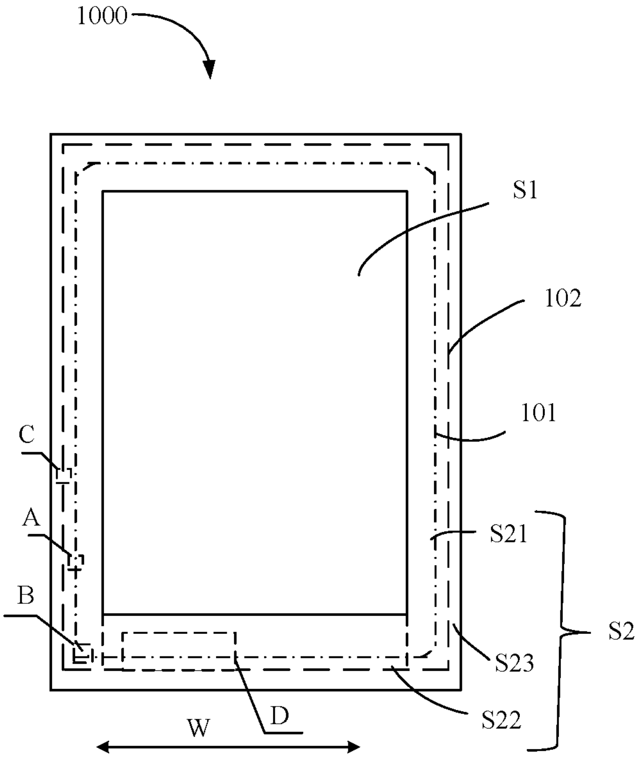
FIG. 1 is a schematic plan view of a display substrate according to an exemplary embodiment of the present application.

Reference will now be made in detail to exemplary embodiments, examples of which are illustrated in the accompanying drawings. When the following description refers to the drawings, the same numerals in different drawings indicate the same or similar elements, unless otherwise indicated. Embodiments described in the following exemplary embodiments are not intended to represent all embodiments consistent with the present disclosure. Rather, they are merely examples of apparatuses consistent with some aspects of the present disclosure as detailed in the appended claims.

Terminology used herein is for the purpose of describing particular embodiments only and is not intended to be limiting of the present disclosure. Unless otherwise defined, technical or scientific terms used herein shall have their ordinary meaning as understood by a person of ordinary skill in the art to which this disclosure pertains. Terms "first," "second," and the like as used in this disclosure and in the claims do not imply any order, quantity, or importance, but are merely used to distinguish one component from another. Similarly, terms "a" or "an" and the like do not denote a limitation on quantity, but rather denote the presence of at least one. "A plurality of" or "several" means two or more. Unless otherwise indicated, terms "front," "rear," "lower," and/or "upper" and the like are for convenience of description only and are not limited to a position or a spatial orientation. Terms "including" or "comprising" and the like are intended to mean that elements or items appearing before "including" or "comprising" encompass elements or items listed after "including" or "comprising" and equivalents thereof, without excluding other elements or items. Terms "connected" or "coupled" and the like are not limited to physical or mechanical connections, but may include electrical connections, whether direct or indirect. As used in this disclosure and the appended claims, the singular forms of "a," "an," "the," and "said" are intended to include plural forms as well, unless the context clearly dictates otherwise. It should also be understood that the term "and/or" as used herein refers to and includes any or all possible combinations of one or more of the associated listed items.

A display panel includes a display substrate and a cover plate (e.g., a glass cover plate) attached to a surface of the display substrate. A display panel with curved edge design has a certain curvature and thus is curved in an edge area thereof. In general, before the cover plate is attached to the display substrate, the cover plate is designed to have a curved edge according to the desired curvature, while the display substrate is in a flat plate shape as a whole. In this case, when the display substrate and the cover plate are assembled, the display substrate is matched with the cover plate to be bent, resulting in layer fracture, which affects the success rate of assembly between the display substrate and the cover plate. To this end, a person of skill in the art can well improve the success rate of assembly between the display substrate and the cover plate by applying a relatively large pre-stress to an edge area of the display substrate which is not finely cut, then finely cutting the display substrate, and in turn assembling the finely cut display substrate with the cover plate. However, applying a relatively large pre-stress to an edge area of the display substrate which is not finely cut results in delamination between an organic layer and an inorganic layer in the edge area of the display substrate which is not finely cut, which adversely affects the display substrate. The inventors have found through research that the delamination between the organic layer and the inorganic layer is more significant at a position with an attitude difference on discontinuous organic layers in the edge area of the display substrate.

In view of this, the present application provides a display substrate, a display panel, and a display apparatus. The display substrate and a method of preparing the same according to embodiments of the present application will be described in detail below in conjunction with the accompanying drawings. Features in the embodiments described below may complement each other or be combined with each other without conflict.

Referring to FIG. 1, and in conjunction with FIGS. 2 through 8, and FIGS. 14 through 16, where necessary, in some embodiments, the present application provides a display substrate 1000. The display substrate 1000 includes a display area S1 and a non-display area S2 on at least one side of the display area S1, where the non-display area S2 includes a first non-display area S21, a second non-display area S22 on a side of the first non-display area S21 away from the display area S1, and a third non-display area S23 on a side of the second non-display area S22 away from the display area S1. The non-display area S2 may sequentially include a retaining-wall area Q1, a crack-blocking area Q2, a cut-retention area Q3, a stress-assurance area Q4, an area corresponding to a rough cut channel 1002 on a side of the stress-assurance area Q4 away from the display area, and other areas outward of the rough cut channel 1002, in a direction away from the display area S1. A junction between the stress-assurance area Q4 and the cut-retention area Q3 may be regarded as a main cut line 101. A portion of the stress-assurance area Q4 connected to the cut-retention area Q3 forms a main cut channel 1001 with the cut-retention area Q3.

Herein, the rough cut channel 1002 has a rough cut line 102. The second non-display area S22 may be understood as an area between the rough cut line 102 and the main cut line 101, that is, the second non-display area S22 includes the stress-assurance area Q4 and an area of the rough cut channel 1002 from the rough cut line 102 toward the display area S1. The first non-display area S21 includes the retaining-wall area Q1, the crack-blocking area Q2, and the cut-retention area Q3. It can be understood that, during preparation of the display panel, a display substrate including the display area S1 and the non-display area S2 as shown in FIG. 1 may be formed, and then the display substrate is roughly cut along the rough cut line 102 to form a display substrate including the display area S1, the first non-display area S21, and the second non-display area S22. For curved screens, a pre-stress may be applied around the display substrate formed after the rough cutting. Further, the display substrate is finely cut along the main cut line 101. After the fine cutting, a portion outward of an edge of the cut-retention area Q3 (i.e., a portion away from the display area) may be cut off to form a display substrate including the display area S1 and the first non-display area S21. The display substrate including the first non-display area S21 and the display area S1 may be finally combined with the cover plate to form a display panel.

The display substrate 1000 includes a base substrate 100, a first organic layer 30, a second organic layer 40, and a first inorganic layer 50. The base substrate 100 includes the display area S1 and the non-display area S2. The first organic layer 30 is disposed on the base substrate 100, and has a first organic raised layer 31 disposed between the main cut channel 1001 in the first non-display area S21 and the rough cut channel 1002 (i.e., in the stress-assurance area Q4) and separated from the rest of the first organic layer 30. The second organic layer 40 is disposed on the first organic layer 30, and has a second organic raised layer 41 disposed between the main cut channel 1001 in the first non-display area S21 and the rough cut channel 1002 (i.e., in the stress-assurance area Q4) and separated from the rest of the second organic layer 40. The second organic raised layer 41 covers the first organic raised layer 31 and forms an assurance-area raised structure 304 with the first organic raised layer 31. The first inorganic layer 50 is disposed on the second organic layer 40 and covers the assurance-area raised structure 304. The first inorganic layer 50 has a third slope 11 and a fourth slope 12 formed on an outer side thereof and corresponding to both sides of the assurance-area raised structure 304. The third slope 11 is closer to the display area S1 than the fourth slope 12. A third dummy metal layer 61 is disposed in the stress-assurance area Q4 and covers at least a portion of the third slope 11 and at least a portion of the fourth slope 12.

Herein, the main cut channel 1001 may also be regarded as a notch portion disposed inwards of the third slope 11. That is, the main cut channel 1001 is a notch portion disposed on a side of the third slope 11 closer to the display area S1. Both the first organic layer 30 and the second organic layer 40 at the notch portion are removed. It should be noted that the first inorganic layer 50 is provided on a surface of the main cut channel 1001. The main cut channel 1001 has a main cut line 101. The main cut line 101 is approximately located in the middle of the main cut channel 1001 and is slightly closer to the display area. The third dummy metal layer 61 may be a metal layer structure that extends a preset width away from the main cut line 101 to the side away from the display area according to a specific size of the structure. In a direction from the display area S1 to the non-display area S2, the metal layer structure may be arranged continuously or discontinuously.

Figure 3:
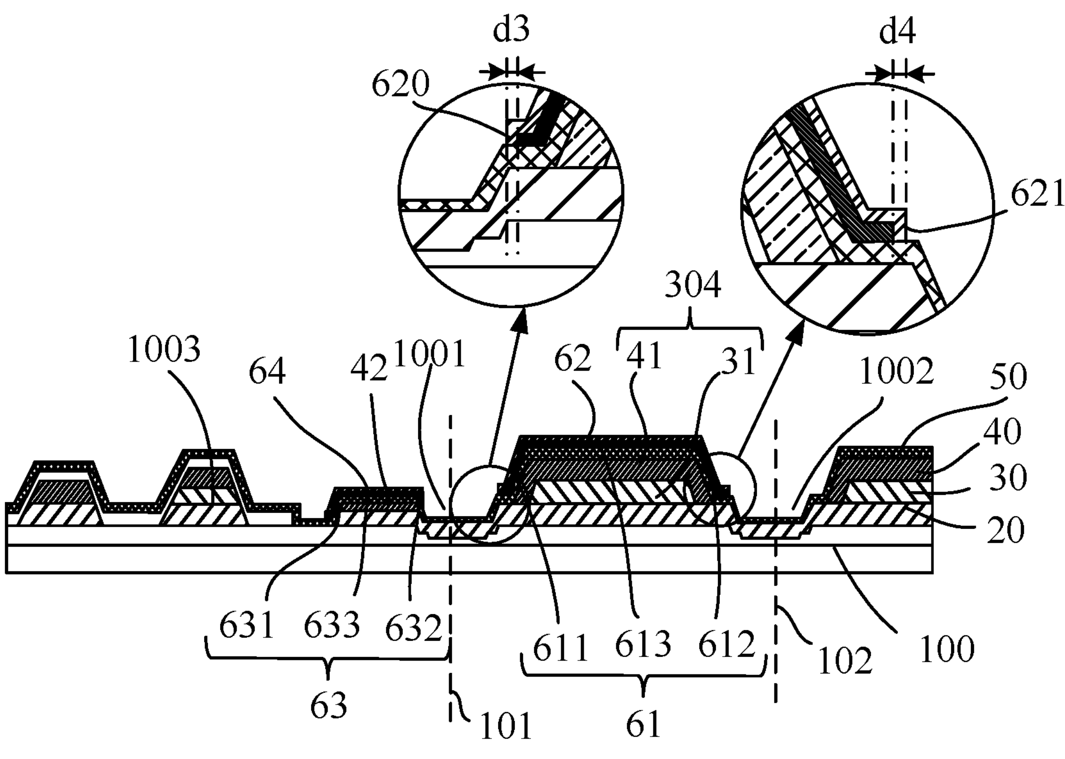
FIG. 3 is a cross-sectional view of a portion of a layer structure in a first non-display area of the display substrate shown in FIG. 1.

As shown in FIG. 3, the third dummy metal layer 61 may cover the third slope 11 and the fourth slope 12, and an area between the third slope 11 and the fourth slope 12. The third dummy metal layer 61 includes a first metal portion 611 covering the third slope 11, a second metal portion 612 covering the fourth slope 12, and a third metal portion 613 between the first metal portion 611 and the second metal portion 612 and connecting the first metal portion 611 and the second metal portion 612.

However, in other embodiments, the third dummy metal layer may cover only one or both of the third slope 11 and the fourth slope 12. Accordingly, the third dummy metal layer does not include the third metal portion.

The first metal portion 611 includes a solid metal layer, a mesh metal layer, or a metal layer formed by connecting a solid metal layer and a mesh metal layer. The second metal portion 612 includes a solid metal layer, a mesh metal layer, or a metal layer formed by connecting a solid metal layer and a mesh metal layer. The third metal portion 613 may include a solid metal layer or a mesh metal layer. The mesh metal layer mentioned herein may be understood as a mesh-like structure layer formed by etching a metal layer, for example, the mesh-like structure indicated by reference numeral 602 in FIG. 4. The solid metal layer may be understood as a structure relative to the mesh-like metal layer formed by etching, and the solid metal layer is actually an un-etched structure layer, for example, the structure layer indicated by reference numeral 601 in FIG. 4.

The display substrate 1000 includes a fourth dummy metal layer 62 overlying the third dummy metal layer 61.

The fourth dummy metal layer 62 has the same structure as the third dummy metal layer 61. The same structure herein may be understood as the solid metal layer of the fourth dummy metal layer 62 being disposed on and corresponding to the solid metal layer of the third dummy metal layer 61. Accordingly, the mesh metal layer of the fourth dummy metal layer 62 is disposed on and corresponding to the mesh metal layer of the third dummy metal layer 61. Moreover, a mesh area and a mesh shape of the third dummy metal layer 61 may be corresponding to and the same as those of the fourth dummy metal layer 62, that is, projections of the third dummy metal layer 61 and the fourth dummy metal layer 62 in a direction perpendicular to the base substrate 100 coincide with each other.

It should be noted that, in other embodiments, the fourth dummy metal layer and the third dummy metal layer may have different structures.

In the case that the first metal portion 611 has a solid metal layer, the solid metal layer is at least located in a portion of the first metal portion 611 close to the main cut channel 1001, and the fourth dummy metal layer 62 has a first wrapping edge 620 formed on a side thereof close to the main cut channel 1001 and extending a first preset distance d3 from an edge of the first metal portion 611 to a side close to the main cut channel 1001, so as to protect the third dummy metal layer 61 and prevent the third dummy metal layer 61 from being affected when the fourth dummy metal layer 62 is formed by etching. The first preset distance d3 herein may be set to be 0.3 μm or more. In some embodiments, the first preset distance may be set to be no more than 1 μm. The first preset distance may be set according to specific conditions, for example, the first preset distance may be set to be 0.5 μm.

Figure 4:
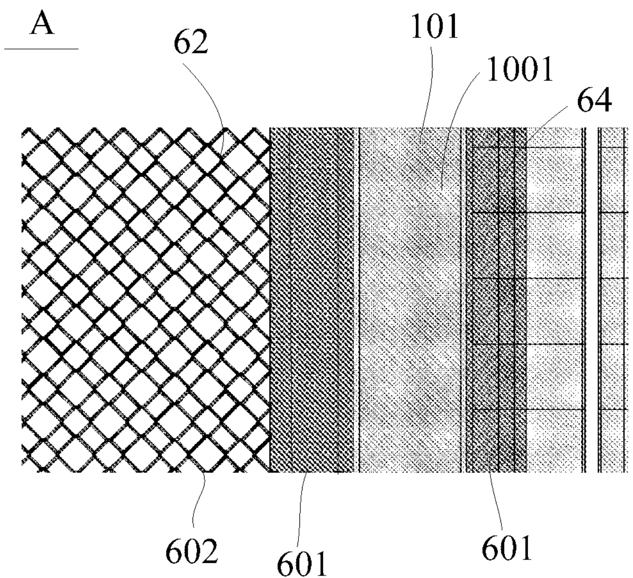
FIG. 4 is a schematic enlarged view of part A of the display substrate shown in FIG. 1.

With continued reference to FIGS. 3 and 4, the first metal portion 611 and a portion of the third metal portion 613 connected to the first metal portion 611 are of a solid metal layer structure, and a corresponding portion of the fourth dummy metal layer 62 is of a solid metal layer structure accordingly. An edge of the fourth dummy metal layer 62 close to the main cut line 101 extends the first preset distance d3 with respect to the edge of the first metal portion 611 to form the first wrapping edge 620.

However, the second metal portion 612 and the fourth dummy metal layer thereon may be disposed in a similar manner to the first metal portion 611 and the fourth dummy metal layer thereon. Accordingly, in the case that the second metal portion 612 has a solid metal layer, the solid metal layer is at least located in a portion of the second metal portion 612 away from the main cut channel 1001, and the fourth dummy metal layer 62 has a second wrapping edge 621 formed on a side thereof away from the main cut channel 1001 and extending a second preset distance d4 from an edge of the second metal portion 612 to a side away from the main cut channel 1001, so as to protect the third dummy metal layer 61 and prevent the third dummy metal layer 61 from being affected when the fourth dummy metal layer 62 is formed by etching. Herein, the second preset distance may also be set to be 0.3 μm or more. In some embodiments, the second preset distance may be set to be no more than 1 μm. The second preset distance may be set according to specific conditions, for example, the second preset distance may be set to be 0.5 μm.

Referring to FIGS. 3 and 6, the second metal portion 612 and a portion of the third metal portion 613 connected to the second metal portion 612 are of a solid metal layer structure, and a corresponding portion of the fourth dummy metal layer 62 is of a solid metal layer structure accordingly. An edge of the fourth dummy metal layer 62 close to the rough cut line 102 extends the second preset distance d4 with respect to the edge of the second metal portion 612 to form the second wrapping edge 621.

With continued reference to FIG. 6, a third preset distance D3 is defined between the edge of the third dummy metal layer 61 and the rough cut channel 1002, so as to prevent adverse effects caused by the metal layer during a cutting operation along the rough cut channel 1002, thereby facilitating the rough cutting of the display substrate 1000 to form a profile of the display substrate.

A value of the third preset distance D3 may be set to be more than 10 μm according to a specific size of the display substrate. For example, in some embodiments, the third preset distance D3 may be set to 10 μm, 11 μm, etc.

Similarly, a preset distance may be defined between the edge of the third dummy metal layer 61 and the main cut channel 1001, so as to prevent adverse effects caused by the metal layer during the cutting operation along the main cut channel 1001, thereby facilitating the further fine cutting of the display substrate 1000.

Referring to FIG. 5, corners of the display substrate need to be rounded, and the main cut channel 101 at a corner is shown in FIG. 5, with two adjacent main cut channels form a cross cutoff.

Figure 2:
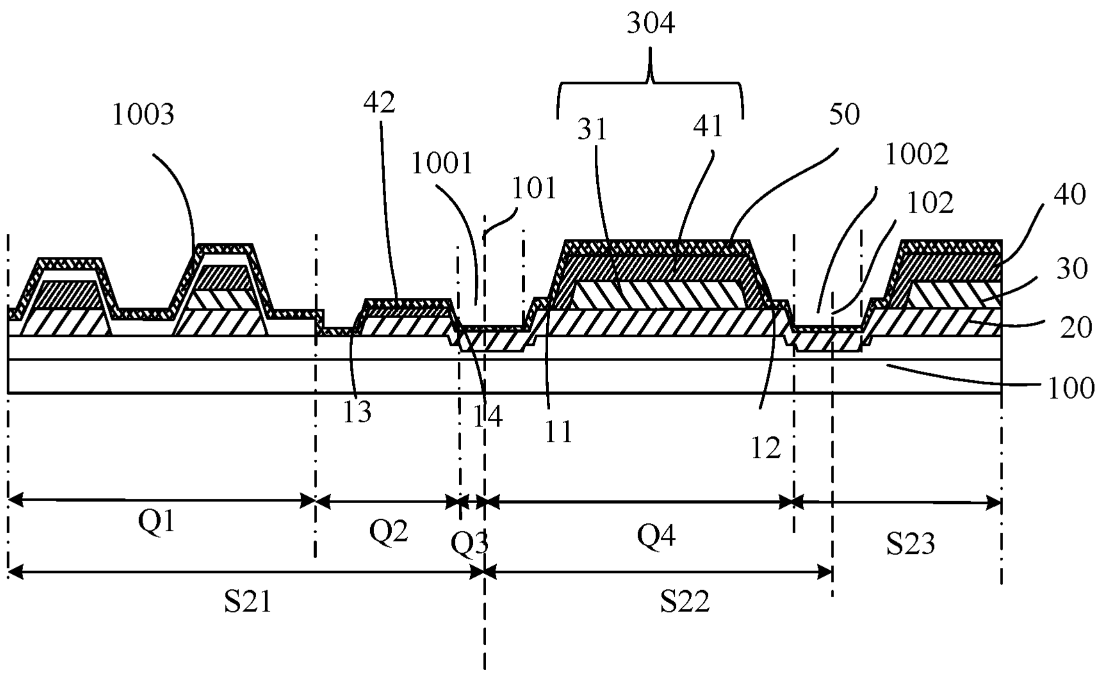
FIG. 2 is a cross-sectional view of a portion of a layer structure in a first non-display area of a display substrate in the related art.

Referring to FIGS. 2 to 4, the display substrate 1000 has an isolation dam structure 1003 in the retaining-wall area Q1.

The second organic layer 40 includes a third organic raised layer 42 disposed in the crack-blocking area Q2 and separated from the rest of the second organic layer 40. The first inorganic layer 50 further covers the third organic raised layer 42, and the first inorganic layer 50 has a first slope 13 and a second slope 14 respectively corresponding to opposite sides of the third organic raised layer 42, where the first slope 13 is closer to the display area S1 than the second slope 14. The display substrate 1000 is provided with a first dummy metal layer 63. The first dummy metal layer 63 is located on the first inorganic layer 50 and covers at least a portion of the first slope 13 and at least a portion of the second slope 14.

With continued reference to FIGS. 2 to 4, in some embodiments, the display substrate 1000 includes a third organic layer 20 between the first organic layer 30 and the base substrate 100. The third organic layer 20 is discontinuous between the third organic raised layer 42 and the isolation dam structure 1003, and an inward end of the third organic layer 20 below the third organic raised layer 42 is closer to the display area than an inward end of the third organic raised layer 42. The first slope 13 extends to a position opposite to the inward end of the third organic layer 20.

It can be understood that the third organic raised layer 42 and the third organic layer 20 below the third organic raised layer 42 form a blocking-area raised layer in the crack-blocking area Q2.

It should be noted that, in some other embodiments, the crack-blocking area Q2 may not be provided with the third organic raised layer. Corresponding first slope and second slope are formed at a break of the third organic layer 20 (e.g., at an end of the third organic layer 20 corresponding to the first slope 13 in the figure) and at a side away from the break (corresponding to where the second slope 14 is located). Accordingly, the blocking-area raised layer of the crack-blocking area Q2 is a corresponding portion of the third organic layer 20.

It can be understood that the "inward" mentioned in the present application may be understood as being closer to the display area S1.

Similar to the third dummy metal layer 61 as described above, the first dummy metal layer 63 may be continuous or discontinuous in the direction from the display area to the non-display area. The first dummy metal layer 63 may be disposed on the first slope 13, the second slope 14, and a surface between the first slope 13 and the second slope 14, or may be disposed on one or both of the first slope 13 and the second slope 14.

With continued reference to FIGS. 2 to 4, the first dummy metal layer 63 includes a fourth metal portion 631 covering the first slope 13, a fifth metal portion 632 covering the second slope 14, and a sixth metal portion 633 between the fourth metal portion 631 and the fifth metal portion 632 and connecting the fourth metal portion 631 and the fifth metal portion 632.

However, in some other embodiments, the first dummy metal layer may cover only one or both of the first slope 13 and the second slope 14. Accordingly, the first dummy metal layer does not include the sixth metal portion.

The fourth metal portion 631 includes a solid metal layer, a mesh metal layer, or a metal layer formed by connecting a solid metal layer and a mesh metal layer. The fifth metal portion 632 includes a solid metal layer, a mesh metal layer, or a metal layer formed by connecting a solid metal layer and a mesh metal layer. The sixth metal portion 633 includes a solid metal layer or a mesh metal layer.

Referring to FIGS. 3 and 4, the display substrate 1000 includes a second dummy metal layer 64 overlying the first dummy metal layer 63.

The second dummy metal layer 64 has the same structure as the first dummy metal layer 63. In the case that the fourth metal portion 631 has a solid metal layer, the solid metal layer is at least located in a portion of the fourth metal portion 631 close to the isolation dam structure 1003, and the second dummy metal layer 64 has a third wrapping edge 640 formed on a side thereof away from the main cut channel 1001 and extending a fourth preset distance d1 from an edge of the fourth metal portion 631 to a side away from the main cut channel 1001.

Figure 14:
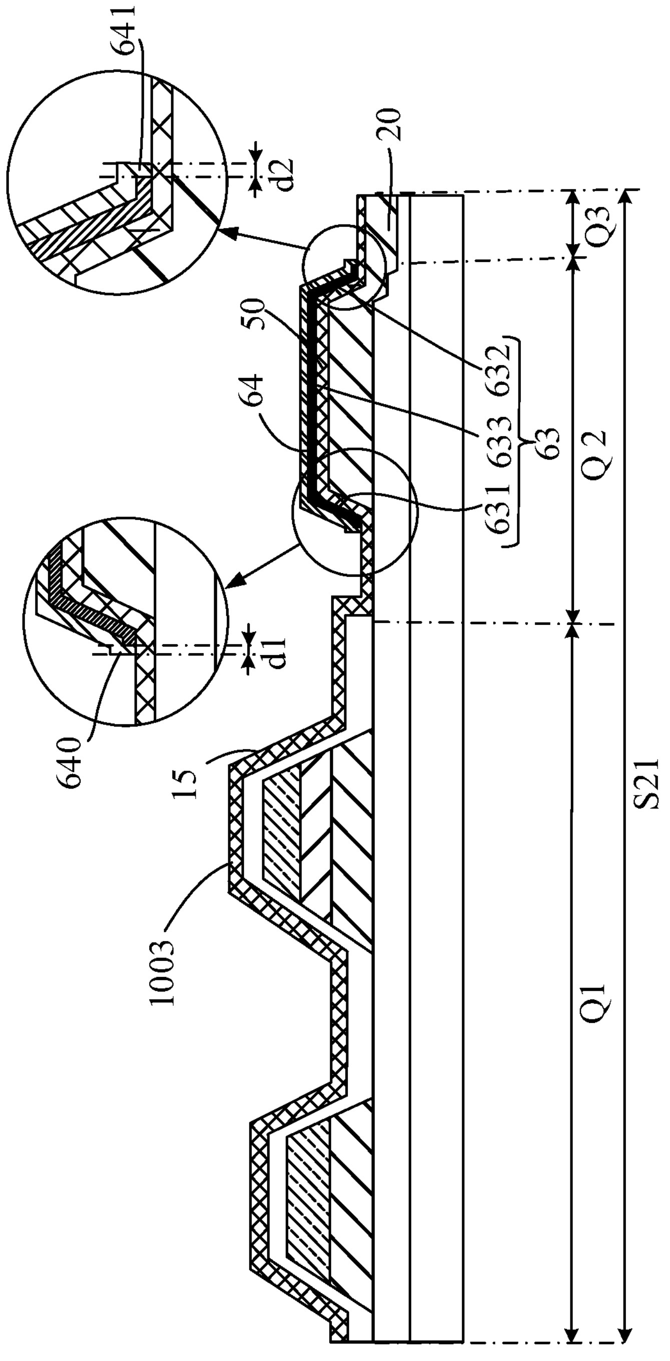
FIG. 14 is a cross-sectional view of a portion of a layer structure of a non-display area of a display substrate according to an exemplary embodiment of the present application.

In the case that the fifth metal portion 632 has a solid metal layer, the solid metal layer is at least located in a portion of the fifth metal portion 632 close to the main cut channel 1001, and the second dummy metal layer 64 has a fourth wrapping edge 641 formed on a side thereof close to the main cut channel 1001 and extending a fifth preset distance d2 from an edge of the fifth metal portion 632 to a side close to the main cut channel 1001, as shown in FIG. 14. The specific values of the fourth preset distance and the fifth preset distance herein are similar to those of the first preset distance and the second preset distance as described above, and reference may be made to the above descriptions relating to the first preset distance and the second preset distance.

It can be understood that the first inorganic layer in the retaining-wall area Q1 has a retaining-wall slope facing the crack-blocking area Q2 on a surface thereof, e.g., the slope of the isolation dam structure 1003 facing the crack-blocking area Q2 in FIG. 3. In some other embodiments, the first dummy metal layer further covers the retaining-wall slope. However, a portion of the first dummy metal layer 63 covering the retaining-wall slope may be continuous or discontinuous with a portion of the first dummy metal layer 63 covering the blocking-area raised layer. The second dummy metal layer has a similar structure to the first dummy metal layer.

Figure 15:
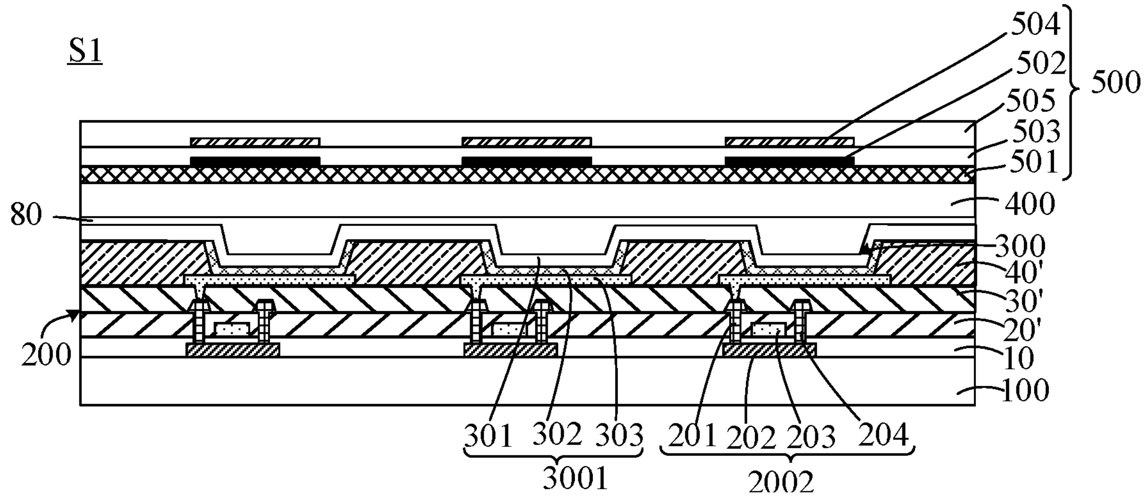
FIG. 15 is a cross-sectional view of a display area of a display substrate according to an exemplary embodiment of the present application.
Figure 16:
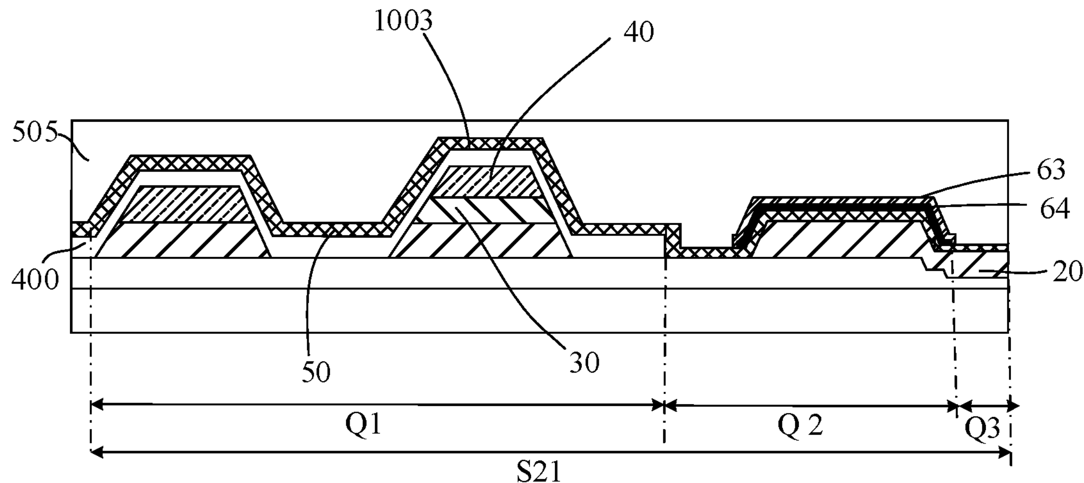
FIG. 16 is a cross-sectional view of a non-display area of a display substrate according to an exemplary embodiment of the present application.

Referring to FIG. 15 and FIG. 16, the display substrate 1000 may include a pixel driving circuit layer 200, a light-emitting layer 300, an encapsulation layer 400, and a touch layer 500 which are sequentially stacked on the base substrate 100 in the display area S1.

In an embodiment, the pixel driving circuit layer 200 includes a pixel driving circuit for driving a light-emitting structure. The pixel driving circuit includes a thin-film transistor 2002. The thin-film transistor 2002 includes an active layer 202, and a gate electrode 203, a first pole 201, and a second pole 204 on a side of the active layer 202 away from the base substrate 100. One of the first pole 201 and the second pole 204 is a source electrode, and the other is a drain electrode. The pixel driving circuit 200 may further include a capacitor (not shown).

The pixel driving circuit layer 200 further includes a gate insulating layer 10, an interlayer dielectric layer 20', and a planarization layer 30'. The gate insulating layer 10 is located between the active layer 202 and the gate electrode 203. The interlayer dielectric layer 20' is located on a side of the gate electrode 203 away from the base substrate 100. The first pole 201 and the second pole 204 are electrically connected to the active layer 202 through vias penetrating the gate insulating layer 10 and the interlayer dielectric layer 20'. The planarization layer 30' is located on a side of the first pole 201 and the second pole 204 away from the base substrate 100, and covers the exposed interlayer dielectric layer 20'.

The light-emitting layer 300 includes a plurality of light-emitting structures 3001 arranged at intervals. The light-emitting structures 3001 of the light-emitting layer 300 may have the same light-emitting color, e.g., blue. Light emitted from the light-emitting layer 300 with the same color is converted into light with a plurality of colors when passing through a color conversion layer, enabling color display of the display panel.

In an embodiment, the light-emitting structures 3001 are located on a side of the planarization layer 30' away from the base substrate 100. Each light-emitting structure 3001 includes a first electrode 303, an organic light-emitting material layer 302 on a side of the first electrode 303 away from the base substrate 100, and a second electrode 301 on a side of the organic light-emitting material layer 302 away from the base substrate 100. The first electrode 303 and the second electrode 301 are in direct contact with the organic light-emitting material layer 302, respectively. The first electrode 303 may be an anode and the second electrode 301 may be a cathode. Second electrodes 301 of the light-emitting structures 3001 may be an integral electrode. The first electrode 303 is electrically connected to the first pole 201 of the thin-film transistor 2002 through a via penetrating the planarization layer 30'. In some embodiments, the display substrate further includes a pixel definition layer 40' provided with a plurality of pixel openings. The pixel openings may be in one-to-one correspondence with the light-emitting structures 3001. The first electrode 303 is disposed below the pixel definition layer 40', and the pixel opening exposes a portion of the first electrode 303 of a corresponding light-emitting structure 3001. At least a portion of the organic light-emitting material layer 302 of the light-emitting structure 3001 is disposed within a corresponding pixel opening. In some embodiments, the light-emitting layer 300 further includes a planarization layer 80 on a side away from the pixel driving circuit layer 200.

Accordingly, the first organic layer 30 further includes a portion located in the display area S1, and the portion of the first organic layer 30 located in the display area S1 is the planarization layer 30' of the pixel driving circuit layer 200.

The second organic layer 40 includes a portion located in the display area S1, and the portion of the second organic layer 40 located in the display area S1 is the pixel definition layer 40' of the light-emitting layer 300.

The third organic layer 20 includes a portion located in the display area S1, and the portion of the third organic layer 20 located in the display area S1 is the interlayer dielectric layer 20' of the pixel driving circuit layer 200.

The first inorganic layer 50 further includes a portion located in the display area S1, and the portion of the first inorganic layer 50 located in the display area S1 is an inorganic layer 501 of the touch layer 500 disposed on a surface of the encapsulation layer 400.

The touch layer 500 further includes a first touch metal layer 502, an inorganic layer 503, a second touch metal layer 504, and an optical adhesive layer 505 sequentially stacked on the inorganic layer 501. The third dummy metal layer 61 and the first dummy metal layer 63 are arranged in the same layer as the first touch metal layer. In the case that the second dummy metal layer 64 and the fourth dummy metal layer 62 are provided, the fourth dummy metal layer 62 and the second dummy metal layer 64 are arranged in the same layer as the second touch metal layer.

The first touch metal layer, the third dummy metal layer 61, and the first dummy metal layer 63 may have a stacked titanium-aluminum-titanium metal layer structure, or a stacked ITO/Ag/ITO metal layer structure. The second touch metal layer, the fourth dummy metal layer 62, and the second dummy metal layer 64 are made of a similar material to the first touch metal layer.

It should be noted that, the first organic layer 30, the second organic layer 40, and the third organic layer 20 are insulating layers, and may be made of the same or different materials. A portion of any two or three of the first organic layer 30, the second organic layer 40, and the third organic layer 20 stacked together is generally integrated, and thus may also be collectively referred to as an insulating layer. The assurance-area raised structure 304 and the blocking-area raised layer may be formed of any one or more of the first organic layer 30, the second organic layer 40, and the third organic layer 20.

Figure 8:
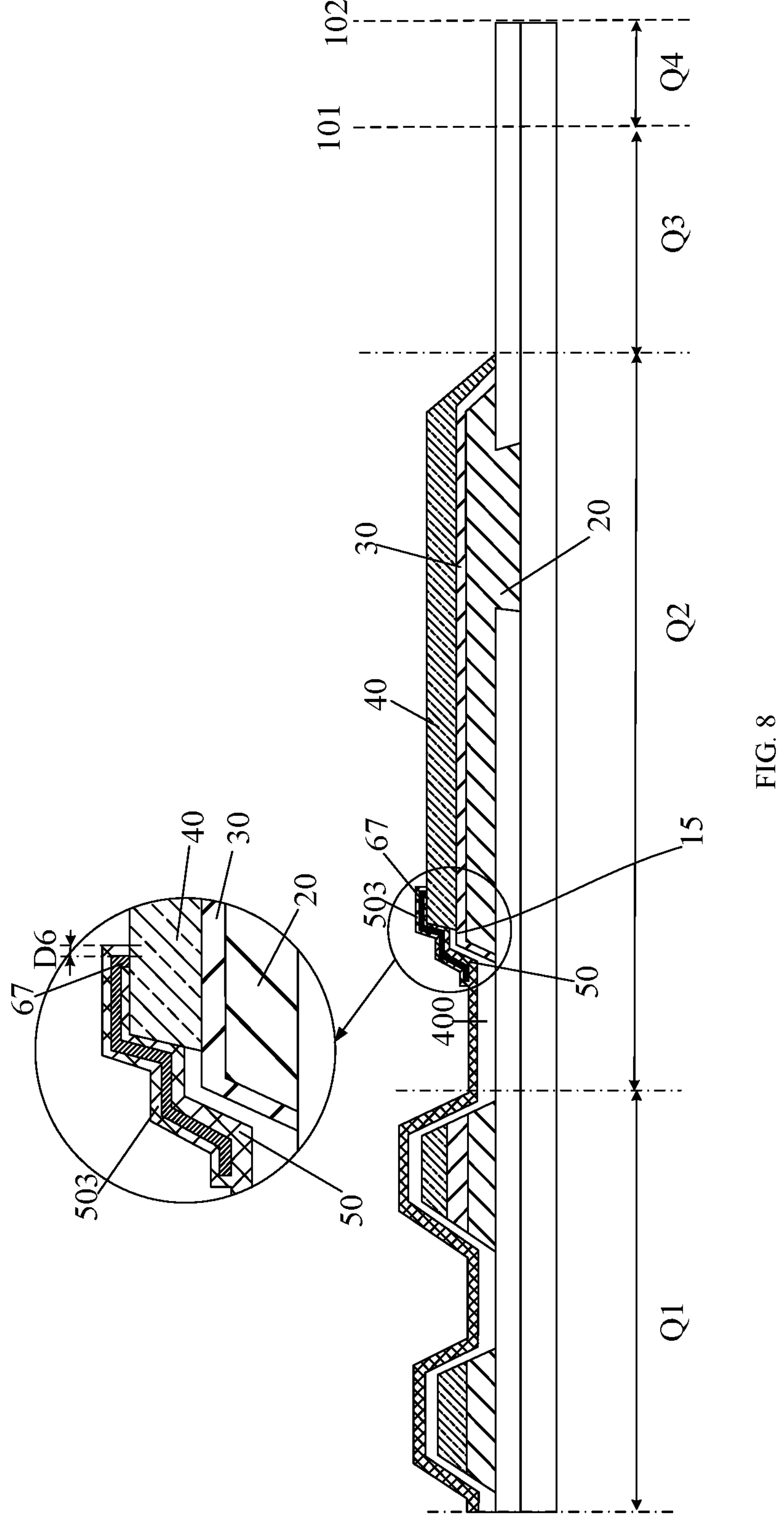
FIG. 8 is a cross-sectional view taken along a section line 103 shown in FIG. 7.

Referring to FIG. 7 and FIG. 8, the first non-display area S21 is provided with a signal line transfer hole 1004 on a bottom of the display substrate 1000. The display substrate may have a set of transfer holes 1004 at a position D as shown in FIG. 1, and may further include another set of transfer holes 1004 at the right side of the position D in FIG. 1. The transfer hole 1004 substantially runs through opposite sides of the crack-blocking area Q2 close to the display area S1 and away from the display area S1.

The first organic layer 30, the second organic layer 40, and the third organic layer 20 are discontinuous in the crack-blocking area on the bottom of the display substrate 1000, to form a fifth slope 15 on opposite sides of the signal line transfer hole 1004 in a width direction of the display substrate 1000 and facing the display area S1.

The display substrate is further provided with a dummy metal block 67. The dummy metal block 67 covers part or all of the fifth slope 15. The dummy metal block 67 may further include corresponding portions extending a certain distance towards the display area S1 and away from the display area S1.

The "width direction" referred to herein may be understood to correspond to a direction indicated by W in FIG. 1.

Herein, the dummy metal block 67 may be formed in the same layer as the first touch metal layer, the third dummy metal layer 61, and the first dummy metal layer 63.

It should be noted that the inorganic layer 503 may extend to the non-display area S2 to form a second inorganic layer in the non-display area S2. The second inorganic layer covers the dummy metal block 67 and at least a portion of the first inorganic layer 50. Compared to an edge of the dummy metal block 67, an edge of the second inorganic layer extends a sixth preset distance D6 toward the side away from the display area S1 to form a wrapping edge wrapping the edge of the dummy metal block 67. The sixth preset distance D6 may be set according to specific conditions, and in some embodiments, the sixth preset distance D6 may be set to any of 5 μm to 15 μm. For example, the sixth preset distance D6 may be set to 10 μm, such that the dummy metal block 67 may not be etched when the second inorganic layer is etched, and water vapor can be prevented from entering the display substrate along the organic layers (the second organic layer 40 and the first organic layer 30) to cause delamination among the film layers in the display substrate. Herein, a portion of the second inorganic layer located in an area denoted by the reference numeral 801 and in an area outward of that area (on a side of the wrapping edge wrapping the edge of the dummy metal block 67 away from the display area S1) may be etched away.

Figure 9:
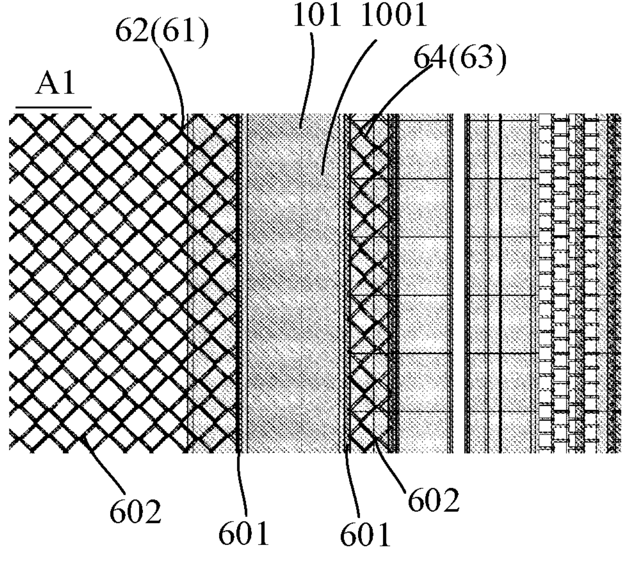
FIG. 9 is a schematic partial enlarged view of a display substrate according to another exemplary embodiment of the present application.

The present application further provides a display substrate. Referring to FIG. 9. FIG. 9 is a schematic partial enlarged view of another display substrate corresponding to part A in the display substrate 1000. The display substrate is substantially the same as the display substrate 1000 as described above, except that a width of the solid metal layer of the third dummy metal layer 61 close to the edge is narrowed, such that a width of an area covered by the mesh metal layer is increased. The middle of the first dummy metal layer 63 is provided in a mesh metal layer structure. The fourth dummy metal layer 62 is disposed corresponding to the third dummy metal layer 61. The second dummy metal layer 64 is disposed corresponding to the first dummy metal layer 63. Compared with the above display substrate 1000, the area covered by the solid metal layer is reduced in this embodiment, which reduces the occurrence of delamination caused by contact between the large metal layer and other layer structures thereon, such as layer structures in which the planarization layer of the touch layer extends to the non-display area.

Figure 10:
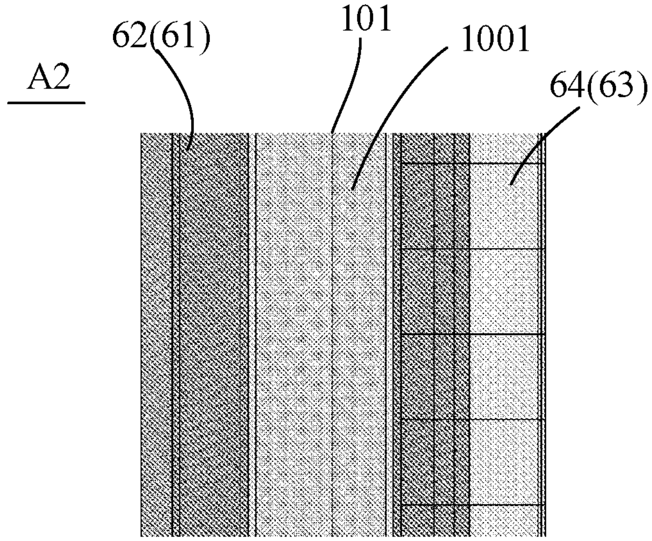
FIG. 10 is a schematic partial enlarged view of a display substrate according to another exemplary embodiment of the present application.

The present application further provides a display substrate. Referring to FIG. 10. FIG. 10 is a schematic partial enlarged view of yet another display substrate corresponding to part A in the display substrate 1000. The display substrate is substantially the same as the display substrate 1000 as described above, except that the third dummy metal layer 61 is disconnected in the middle and is provided with no mesh metal layer. A side of the first dummy metal layer 64 away from the main cut channel 1001 is narrowed, such that a width of the first dummy metal layer 64 is narrowed as a whole to the degree where an edge of the first dummy metal layer 64 is located directly above a boundary of the third organic layer 20 or extends a preset distance beyond the boundary of the third organic layer 20. The preset distance may be several microns, e.g., 5 μm.

Figure 11:
FIG. 11 is a cross-sectional view of a portion of a layer structure in a first non-display area of a display substrate according to another exemplary embodiment of the present application.
Figure 11:
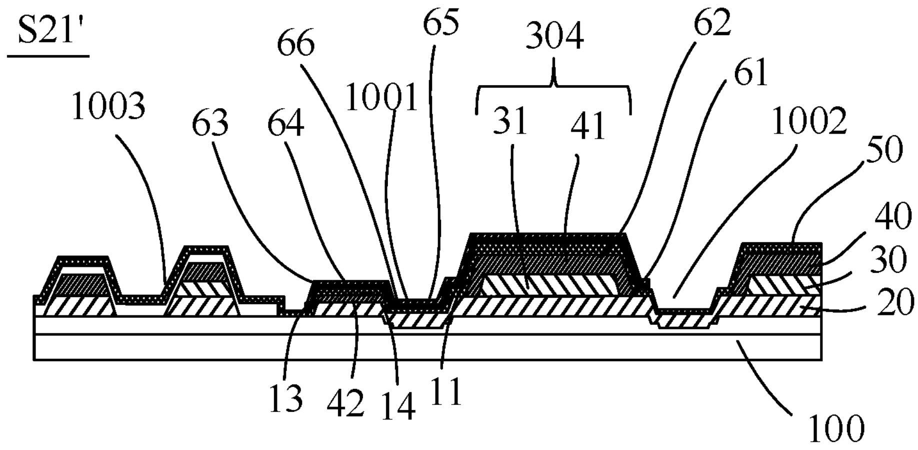
Figure 12:
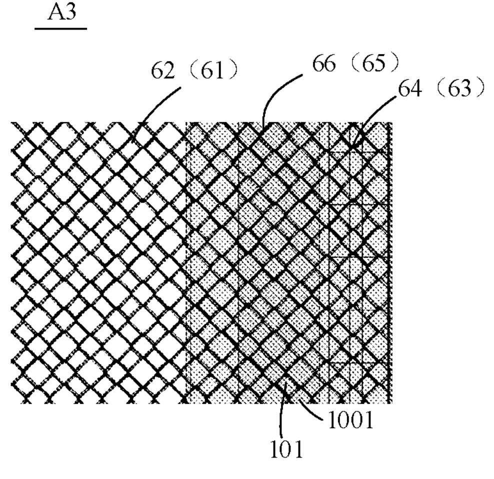
FIG. 12 is a schematic partial enlarged view of the display substrate shown in FIG. 11.
Figure 13:
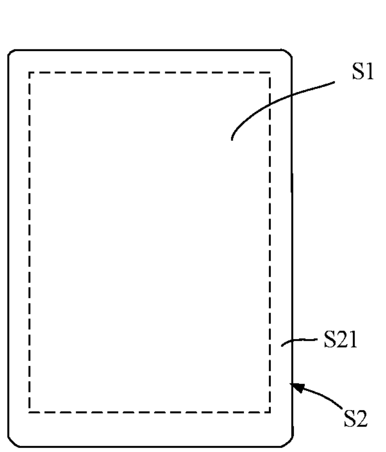
FIG. 13 is a plan view of a display area of a display substrate according to an exemplary embodiment of the present application.

The present application further provides a display substrate. Referring to FIG. 11 and FIG. 12. FIG. 11 is a cross-sectional view of a first non-display area in yet another display substrate, and FIG. 12 is a schematic partial enlarged view of the display substrate corresponding to part A in the display substrate 1000. This display substrate is mostly the same as the display substrate 1000 as described above, except for the specific structure of each dummy metal layer. In this embodiment, a fifth dummy metal layer 65 is disposed on the first inorganic layer 50 in the entirety of the cut-retention area Q3 or the main cut channel 1001. The fifth dummy metal layer 65 may be between the third dummy metal layer 61 and the first dummy metal layer 63 and connect the third dummy metal layer 61 and the first dummy metal layer 63, and the fifth dummy metal layer 65 includes a mesh metal layer.

A sixth dummy metal layer 66 is disposed on the fifth dummy metal layer 65. In the case that the second dummy metal layer 64 and the fourth dummy metal layer 62 are provided, the sixth dummy metal layer 66 is between the fourth dummy metal layer 62 and the second dummy metal layer 64 and connects the fourth dummy metal layer 62 and the second dummy metal layer 64.

Accordingly, the third dummy metal layer 61, the fifth dummy metal layer 65, and the first dummy metal layer 63 are sequentially connected to form a large dummy metal layer covering a relatively large area. The large dummy metal layer has a solid metal layer structure with a preset width on both sides thereof away from the main cut channel 1001, and includes a mesh metal layer in most of the area in the middle thereof. The fourth dummy metal layer 62, the sixth dummy metal layer 66, and the second dummy metal layer 64 are connected in sequence to form another large dummy metal layer covering a relatively large area, which is identical to the large dummy metal layer formed by the third dummy metal layer 61, the fifth dummy metal layer 65, and the first dummy metal layer 63. Compared with the dummy metal layers in the above embodiments, the dummy metal layer in this embodiment has a larger coverage range, and at the same time, the area covered by the solid metal layer is further reduced, so as to further reduce the occurrence of delamination caused by contact between the dummy metal layer and other layer structures thereon, such as layer structures in which the planarization layer of the touch layer extends to the non-display area.

The present application further provides a display substrate 2000, as shown in FIGS. 13 to 16. The display substrate 2000 may be formed by finely cutting the display substrate 1000 along the main cut line 101. The display substrate 2000 may be attached to a cover plate (not shown) to form a display panel.

The present application further provides a display panel, which includes the display substrate 2000 and a cover plate. The cover plate is disposed on a side of the display substrate 2000 away from the base substrate 100.

The present application further provides a display apparatus, such as a mobile phone, a computer, a television, and other display device with a display panel. The display apparatus may include the display panel as described above.

The present application further provides a method of preparing a display substrate, which can be used to prepare the display substrate 1000 as described above. The method includes steps S101 to S109.

At step S101, a base substrate 100 is provided, the base substrate 100 having a display area and a non-display area on at least one side of the display area, the non-display area including a first non-display area S21 and a second non-display area S22 connected to the first non-display area S21.

At step S103, a first organic layer 30 is formed on the base substrate 100, and the first organic layer 30 is processed to form a first organic raised layer 31 disposed between a main cut channel 1001 in the first non-display area S21 and a rough cut channel 1002 (i.e., in a stress-assurance area Q4) and separated from the rest of the first organic layer 30.

At step S105, a second organic layer 40 is formed on the first organic layer 30, and the second organic layer 40 is processed to form a second organic raised layer 41 disposed between the main cut channel 1001 in the first non-display area S21 and the rough cut channel 1002 (i.e., in the stress-assurance area Q4) and separated from the rest of the second organic layer 40. The second organic raised layer 41 covers the first organic raised layer 31 and forms an assurance-area raised structure 304 with the first organic raised layer 31.

At step S107, a first inorganic layer 50 is formed on the second organic layer 40, where the first inorganic layer 50 covers the assurance-area raised structure 304, the first inorganic layer 50 has a third slope 11 and a fourth slope 12 formed on an outer side thereof and corresponding to both sides of the assurance-area raised structure 304, and the third slope 11 is closer to the display area than the fourth slope 12.

At step S109, a first metal layer is formed on the first inorganic layer 50, and the first metal layer is processed to form a third dummy metal layer 61 in the first non-display area S21. The third dummy metal layer 61 covers at least a portion of the third slope 11 and at least a portion of the fourth slope 12.

Herein, for the specific structures of the base substrate 100, the organic layers, the inorganic layers, and the dummy metal layers, reference may be made to the relevant descriptions above.

After step S109, the method further includes steps S111 and S113.

At step S111, a second inorganic layer is disposed on the first metal layer, and a portion of the second inorganic layer in the first non-display area S21 is removed.

At step S113, a second metal layer is disposed on the second inorganic layer, and the second metal layer is processed to form a fourth dummy metal layer 62 overlying the third dummy metal layer 61.

In some embodiments, when the third dummy metal layer 61 is formed at step S109, a first touch metal layer located in the display area, a first dummy metal layer 63, and a fifth dummy metal layer 65, signal traces (such as 2T2R Trace and 2T1R Trace) located in the non-display area, and lower portions of connecting lines of the touch metal layer located in the display area may be formed.

When the fourth dummy metal layer 62 is formed at step S113, a second touch metal layer located in the display area, a second dummy metal layer 64, and a sixth dummy metal layer 66, signal traces located in the non-display area, and upper portions of the connecting lines of the touch metal layer located in the display area may be formed.

In some embodiments, the method further includes:

providing a signal line transfer hole 1004 in the first non-display area S21. The transfer hole 1004 substantially runs through opposite sides of the crack-blocking area Q2 close to the display area S1 and away from the display area S1.

The first organic layer 30, the second organic layer 40, and the third organic layer 20 are discontinuous in the crack-blocking area on the bottom of the display substrate, to form a fifth slope 15 on opposite sides of the signal line transfer hole 1004 in a width direction of the display substrate and facing the display area S1.

The method further includes forming a dummy metal block 67 on the fifth slope 15. The dummy metal block 67 covers part or all of the fifth slope 15. The dummy metal block 67 may further include corresponding portions extending a certain distance towards the display area S1 and away from the display area S1.

The "width direction" referred to herein may be understood to correspond to a direction indicated by W in FIG. 1.

Herein, the dummy metal block 67 may be formed in the same layer as the first touch metal layer, the third dummy metal layer 61, and the first dummy metal layer 63.

It should be noted that the inorganic layer 503 may extend to the non-display area S2 to form a second inorganic layer in the non-display area S2. The second inorganic layer covers the dummy metal block 67 and at least a portion of the first inorganic layer 50. Compared to an edge of the dummy metal block 67, an edge of the second inorganic layer extends a sixth preset distance D6 toward the side away from the display area S1 to form a wrapping edge wrapping the edge of the dummy metal block 67.

In the present application, the structure embodiment and the method embodiment may complement each other without conflict.

The foregoing are merely preferred embodiments of the present disclosure, and are not intended to limit the present disclosure in any form. Although the present disclosure has been disclosed as above in the preferred embodiments, they are not intended to limit the present disclosure. Any person of skill in the art, without departing from the scope of the technical solutions of the present disclosure, may make some changes or modifications into equivalent embodiments with equivalent changes by using the above disclosed technical contents. Any simple variations, equivalent changes and modifications made to the above embodiments based on the technical essence of the present disclosure, without deviating from the contents of the technical solutions of the present disclosure, still fall within the scope of the technical solutions of the present disclosure.

The invention claimed is:

1. A display substrate, comprising a display area and a non-display area on at least one side of the display area, the non-display area comprising at least a retaining-wall area, a crack-blocking area, and a cut-retention area in a direction away from the display area, the display substrate comprising:

a base substrate;

an insulating layer on the base substrate, the insulating layer comprising a blocking-area raised layer in the crack-blocking area;

a first inorganic layer on the insulating layer and at least partially covering the blocking-area raised layer, wherein the first inorganic layer comprises a first slope and a second slope respectively corresponding to opposite sides of the blocking-area raised layer, the first slope being closer to the display area than the second slope; and a first dummy metal layer in the non-display area and covering at least a portion of the first slope and at least a portion of the second slope.

2. The display substrate according to claim 1, wherein the first dummy metal layer further covers an area between the first slope and the second slope.

3. The display substrate according to claim 2, wherein the first inorganic layer is in the retaining-wall area and has a retaining-wall slope facing the crack-blocking area, and the first dummy metal layer further covers the retaining-wall slope.

4. The display substrate according to claim 1, further comprising a second dummy metal layer on the first dummy metal layer.

5. The display substrate according to claim 1, wherein the non-display area has a signal line transfer hole on a bottom of the display substrate;

the insulating layer is discontinuous in the crack-blocking area on the bottom of the display substrate, to form a fifth slope on opposite sides of the signal line transfer hole in a width direction of the display substrate and facing the display area; and the display substrate comprises a dummy metal block covering at least a portion of the fifth slope.

6. The display substrate according to claim 5, further comprising a second inorganic layer, wherein the second inorganic layer covers the dummy metal block and at least a portion of the first inorganic layer, and an edge of the second inorganic layer extends 5 μm to 15 μm from an edge of the dummy metal block to a side away from the display area.

7. The display substrate according to claim 1, wherein the non-display area further comprises a stress-assurance area on a side of the cut-retention area away from the display area;

the insulating layer has an assurance-area raised structure in the stress-assurance area, the assurance-area raised structure being separated from the rest of the insulating layer;

the first inorganic layer covers the assurance-area raised structure, and has a third slope and a fourth slope on a surface thereof away from the base substrate and corresponding to both sides of the assurance-area raised structure, the third slope being closer to the display area than the fourth slope; and the display substrate further comprises a third dummy metal layer in the stress-assurance area and covering at least a portion of the third slope and at least a portion of the fourth slope.

8. The display substrate according to claim 7, wherein the third dummy metal layer comprises a first metal portion covering the third slope and a second metal portion covering the fourth slope.

9. The display substrate according to claim 8, wherein the third dummy metal layer further comprises a third metal portion between the first metal portion and the second metal portion and connecting the first metal portion and the second metal portion.

10. The display substrate according to claim 9, wherein the first metal portion comprises at least one of a solid metal layer, or a mesh metal layer, the second metal portion comprises at least one of a solid metal layer, or a mesh metal layer, and the third metal portion comprises a mesh metal layer or a solid metal layer.

11. The display substrate according to claim 10, further comprising:

a fourth dummy metal layer overlying the third dummy metal layer.

12. The display substrate according to claim 11, wherein the fourth dummy metal layer and the third dummy metal layer have a same structure, the first metal portion comprises the solid metal layer at least in a portion of the first metal portion close to the cut-retention area, and the fourth dummy metal layer has a first wrapping edge on a side thereof close to the cut-retention area and extending a first preset distance from an edge of the first metal portion to a side close to the cut-retention area; and/or the second metal portion comprises the solid metal layer at least in a portion of the second metal portion away from the cut-retention area, and the fourth dummy metal layer has a second wrapping edge on a side thereof away from the cut-retention area and extending a second preset distance from an edge of the second metal portion to a side away from the cut-retention area.

13. The display substrate according to claim 7, wherein the display substrate has a rough cut channel on a side of the stress-assurance area away from the display area, and an edge of the third dummy metal layer is at a third preset distance from the rough cut channel, the third preset distance being 10 μm or more.

14. The display substrate according to claim 4, wherein the first dummy metal layer comprises a fourth metal portion covering the first slope and a fifth metal portion covering the second slope, and wherein the first dummy metal layer further comprises a sixth metal portion between the fourth metal portion and the fifth metal portion and connecting the fourth metal portion and the fifth metal portion.

15. The display substrate according to claim 14, wherein the fourth metal portion comprises at least one of a solid metal layer, or a mesh metal layer, the fifth metal portion comprises at least one of a solid metal layer, or a mesh metal layer, and the sixth metal portion comprises a mesh metal layer or a solid metal layer.

16. The display substrate according to claim 15, wherein the second dummy metal layer and the first dummy metal layer have a same structure, the fourth metal portion comprises the solid metal layer at least in a portion of the fourth metal portion close to the retaining-wall area, and the second dummy metal layer has a third wrapping edge on a side thereof away from the cut-retention area and extending a fourth preset distance from an edge of the fourth metal portion to a side away from the cut-retention area; and/or the fifth metal portion comprises the solid metal layer at least in a portion of the fifth metal portion close to the cut-retention area, and the second dummy metal layer has a fourth wrapping edge on a side thereof close to the cut-retention area and extending a fifth preset distance from an edge of the fifth metal portion to a side close to the cut-retention area.

17. The display substrate according to claim 11, wherein the display substrate comprises a pixel driving circuit layer, a light-emitting layer, an encapsulation layer, and a touch layer which are sequentially stacked on the base substrate in the display area;

the insulating layer further comprises a portion in the display area, which comprises at least one of an interlayer dielectric layer of the pixel driving circuit layer, a planarization layer of the pixel driving circuit layer, or a pixel definition layer of the light-emitting layer;

the first inorganic layer further comprises a portion in the display area, which comprises an inorganic layer of the touch layer disposed on a surface of the encapsulation layer; and the touch layer further comprises a first touch metal layer, a second inorganic layer, and a second touch metal layer which are sequentially stacked on the first inorganic layer, wherein the first dummy metal layer and the third dummy metal layer are arranged in a same layer as the first touch metal layer, a second dummy metal layer is further disposed on the first dummy metal layer, and the second dummy metal layer and the fourth dummy metal layer are arranged in a same layer as the second touch metal layer.

18. The display substrate according to claim 11, wherein a fifth dummy metal layer is disposed on the first inorganic layer in the cut-retention area, the fifth dummy metal layer is between the first dummy metal layer and a third dummy metal layer and connects the first dummy metal layer and the third dummy metal layer, and the fifth dummy metal layer comprises a mesh metal layer; and a sixth dummy metal layer is disposed on the fifth dummy metal layer, a second dummy metal layer is further disposed on the first dummy metal layer, and the sixth dummy metal layer is between the second dummy metal layer and the fourth dummy metal layer and connects the second dummy metal layer and the fourth dummy metal layer.

19. A display panel, comprising a cover plate and the display substrate according to claim 1.

20. A display apparatus, comprising the display panel according to claim 19.

* * * * *